(12) United States Patent
Ding et al.

(10) Patent No.: US 11,227,779 B2
(45) Date of Patent: Jan. 18, 2022

(54) APPARATUS AND METHOD FOR PROCESSING A SEMICONDUCTOR DEVICE

(71) Applicant: ASM Technology Singapore Pte Ltd, Singapore (SG)

(72) Inventors: Jiapei Ding, Singapore (SG); Kar Weng Yan, Singapore (SG); Teng Hock Kuah, Singapore (SG); Jian Liao, Singapore (SG); Keng Yew Song, Singapore (SG); Bin Yuan, Singapore (SG); Deivasigamani Mouleeswaran, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 289 days.

(21) Appl. No.: 15/701,870

(22) Filed: Sep. 12, 2017

(65) Prior Publication Data
US 2019/0080939 A1 Mar. 14, 2019

(51) Int. Cl.
*H01L 21/67* (2006.01)
*H01L 21/56* (2006.01)
(Continued)

(52) U.S. Cl.
CPC ...... *H01L 21/67092* (2013.01); *H01L 21/565* (2013.01); *H01L 21/568* (2013.01);
(Continued)

(58) Field of Classification Search
CPC ............. H01L 21/67092; H01L 21/565; H01L 21/568; H01L 21/68; H01L 21/687;
(Continued)

(56) References Cited

U.S. PATENT DOCUMENTS 4,418,646 A * 12/1983 Zajac ................ H01L 21/67126
118/50
2004/0247424 A1* 12/2004 Blattner .................. H01L 21/68
414/754
(Continued)

FOREIGN PATENT DOCUMENTS

JP H10-311429 A 11/1998
JP 2004000915 * 1/2004
(Continued)

OTHER PUBLICATIONS

Japanese Office Action, dated Sep. 30, 2019, issued in corresponding Japanese Patent Application No. 2018-169540. English translation. Total 15 pages.

*Primary Examiner* — Francisco W Tschen
*Assistant Examiner* — Guy F Mongelli
(74) *Attorney, Agent, or Firm* — Ostrolenk Faber LLP

(57) ABSTRACT

The invention provides an apparatus, for processing a semiconductor device, comprising a first tool which comprises a pressure application component, a guide, and a spacer moveable in the guide. A gap is defined between the spacer and the guide and is operable to allow the spacer to tilt in relation to the guide. The apparatus also comprises a second tool for holding the semiconductor device, wherein the first and second tools are moveable relative to each other between an uncoupled state and a coupled state. The spacer comprises a first portion proximate the pressure application component, wherein in the coupled state, the pressure application component is operable to apply a force as a first pressure to the first portion. The spacer also comprises a second portion distal from the pressure application component, wherein in the coupled state, the second portion is proximate the semiconductor device and is operable to (Continued)

transmit the force from the pressure application component to the semiconductor device as a second pressure.

19 Claims, 12 Drawing Sheets

(51) Int. Cl.
    *H01L 21/68* (2006.01)
    *H01L 21/687* (2006.01)
    *H01L 23/00* (2006.01)

(52) U.S. Cl.
    CPC .. *H01L 21/67126* (2013.01); *H01L 21/67253* (2013.01); *H01L 21/68* (2013.01); *H01L 21/687* (2013.01); *H01L 24/75* (2013.01); *H01L 24/83* (2013.01); *H01L 21/67098* (2013.01); *H01L 2224/75101* (2013.01); *H01L 2224/75301* (2013.01); *H01L 2224/75755* (2013.01); *H01L 2224/75981* (2013.01); *H01L 2224/83002* (2013.01); *H01L 2224/83005* (2013.01); *H01L 2224/8384* (2013.01); *H01L 2224/83149* (2013.01); *H01L 2224/83201* (2013.01); *H01L 2924/3511* (2013.01)

(58) Field of Classification Search
    CPC ... H01L 24/75; H01L 24/83; H01L 21/67253; H01L 21/67126; H01L 2224/83149; H01L 21/67098; H01L 2224/75101; H01L 2224/75301; H01L 2224/75755; H01L 2224/75981; H01L 2224/83002; H01L 2224/83005; H01L 2924/3511; H01L 2224/83201; H01L 2224/8384
    See application file for complete search history.

(56) References Cited

U.S. PATENT DOCUMENTS

| | | | | |
|---|---|---|---|---|
| 2005/0048880 A1* | 3/2005 | Tolles | ..................... | B08B 1/007 451/66 |
| 2005/0260345 A1* | 11/2005 | Lubomirsky | ....... | C23C 18/1619 427/240 |
| 2007/0122551 A1* | 5/2007 | Yamamoto | ............ | G03F 7/3021 427/240 |
| 2007/0196699 A1* | 8/2007 | Aida | ....................... | B24B 9/065 428/846.1 |
| 2007/0268031 A1* | 11/2007 | Di Stefano | .......... | G01R 1/0416 324/754.03 |
| 2008/0076253 A1* | 3/2008 | Fukada | ............. | H01L 21/31053 438/692 |
| 2008/0105986 A1* | 5/2008 | Schmid | ................... | H01L 24/83 257/778 |
| 2008/0202249 A1* | 8/2008 | Yokura | ................. | G01L 1/2293 73/726 |
| 2009/0060687 A1* | 3/2009 | White | ............... | H01L 21/67126 414/217 |
| 2011/0018158 A1* | 1/2011 | Menard | ............. | H01L 21/67092 264/101 |
| 2012/0049300 A1* | 3/2012 | Yamaguchi | ........... | G01L 19/147 257/417 |
| 2013/0248114 A1* | 9/2013 | Seok | ................... | H01L 21/6838 156/382 |
| 2015/0014876 A1* | 1/2015 | Yamashita | ............ | G03F 7/0002 264/40.1 |
| 2015/0096689 A1* | 4/2015 | Wimplinger | ....... | H01L 21/68707 156/701 |
| 2015/0371880 A1* | 12/2015 | De Beijer | ............. | H01L 23/495 257/787 |
| 2016/0208395 A1* | 7/2016 | Ooshima | ........... | H01J 37/32926 |
| 2016/0351492 A1* | 12/2016 | Watanabe | ............... | H01L 24/05 |
| 2017/0047237 A1* | 2/2017 | Kobata | ............... | H01L 21/6838 |
| 2017/0066075 A1* | 3/2017 | Matsubayashi | ......... | H01L 21/52 |
| 2017/0229336 A1* | 8/2017 | Thallner | ........... | H01L 21/68785 |
| 2017/0236738 A1* | 8/2017 | Van Lieshout | ....... | H01L 21/681 425/135 |
| 2017/0243769 A1* | 8/2017 | George | ............. | H01L 21/67092 |
| 2017/0372925 A1* | 12/2017 | Johnson | ............... | H01L 21/6838 |

FOREIGN PATENT DOCUMENTS

| | | |
|---|---|---|
| JP | 2016-507164 | 3/2016 |
| WO | WO 2009/119096 A1 | 10/2009 |
| WO | WO 2014/123413 A1 | 8/2014 |

\* cited by examiner

APPARATUS AND METHOD FOR PROCESSING A SEMICONDUCTOR DEVICE

TECHNICAL FIELD

The present invention relates to an apparatus for molding or sintering a semiconductor device. The present invention also relates to a method for molding or sintering a semiconductor device.

BACKGROUND

A conventional molding apparatus typically includes a base plate and a cover for holding a semiconductor device while introducing molding compound. However, the semiconductor device may not have parallel surfaces and thus the top surface of the semiconductor device may be sloping when it is placed in the apparatus. The inhomogeneity of forces applied on the semiconductor device during molding may lead to undesirable molding outcomes, potentially even damaging the semiconductor device. Accordingly, more adjustment time is needed when such cases are encountered and higher throughput cannot be achieved.

Therefore, a cost effective solution, for molding or sintering semiconductor devices, with high throughput and high quality is desired.

SUMMARY

The present invention thus seeks to provide an improved apparatus which ameliorates the abovementioned issues. The improved molding apparatus provides for alignment between semiconductor devices and apparatus components, thus achieving better force distribution and higher processing quality.

Accordingly, the invention provides an apparatus, for processing a semiconductor device, comprising: a first tool comprising: a pressure application component; a guide; and a spacer moveable in the guide; wherein a gap is defined between the spacer and the guide and is operable to allow the spacer to tilt in relation to the guide; and a second tool for holding the semiconductor device, wherein the first and second tools are moveable relative to each other between an uncoupled state and a coupled state; wherein the spacer comprises: a first portion proximate the pressure application component, wherein in the coupled state, the pressure application component is operable to apply a force as a first pressure to the first portion; and a second portion distal from the pressure application component, wherein in the coupled state, the second portion is proximate the semiconductor device and is configured to transmit the force from the pressure application component to the semiconductor device as a second pressure.

The present invention also provides a method of processing a semiconductor, comprising: providing an apparatus with a first tool and a second tool moveable relative to each other, wherein the second tool comprises a holder and wherein the first tool comprises a pressure chamber and a movable spacer moveable in a guide, and wherein the first tool comprises a gap between the spacer and the guide operable to allow the spacer to tilt in relation to the guide, and wherein the first tool and the second tool are in an uncoupled state; arranging a semiconductor device on the holder; bringing the first tool and the second tool from the uncoupled state to a coupled stated; compressing the semiconductor device between the spacer and the holder, by applying pressure from the pressure chamber on the spacer; waiting a pre-determined period of time; bringing the first tool and the second tool from the coupled state to the uncoupled stated.

BRIEF DESCRIPTION OF THE DRAWINGS

The invention will be better understood with reference to the detailed description when considered in conjunction with the non-limiting examples and the accompanying drawings, in which.

Figure 1:
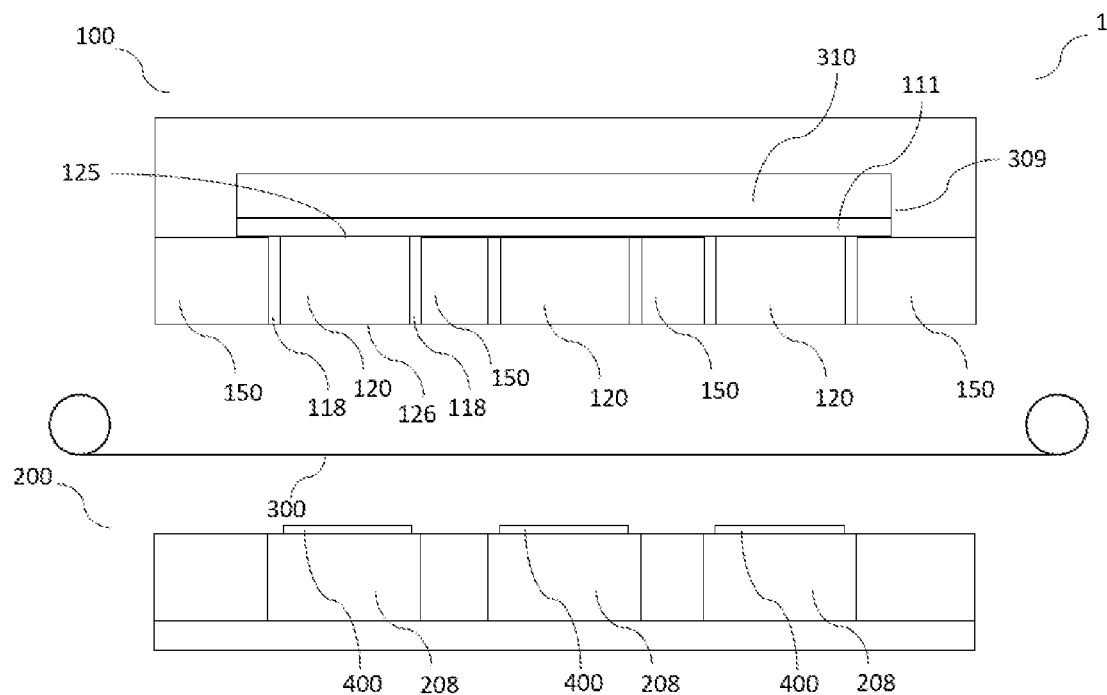
FIG. 1 shows an exemplary cross sectional schematic of the apparatus according to an embodiment of the invention.

The figures are of schematic nature and not drawn to scale so as to emphasize certain aspects of the invention.

DETAILED DESCRIPTION

The following detailed description refers to the accompanying drawings that show, by way of illustration, specific details and embodiments in which the invention may be practiced. The used reference numerals are the same across the figures.

In all embodiments of the invention the apparatus 1 may comprise a plurality of spacers, each in a corresponding guide. To simplify the explanation of the invention, reference will be made to the characteristics of a spacer and a corresponding guide, however these explanations apply also to a plurality of spacers and guides having the characteristics as explained in the present disclosure. A plurality of holders may also be provided, each holder corresponding to one spacer, and a holder may also relate to more than one spacer, especially for more complex circuits.

The terms "bottom", "top", "over", "under", may refer to the position shown in the figures, the first tool and the second tool are illustrated in such a way that the first tool is at the "top" and the second tool is at the "bottom", the same orientation may be used for other elements within the present disclosure.

The term "tilt", "tilting", or "tilting motion" is used herein to refer to the motion of a spacer in the associated guide where the angle between an axis of the spacer and an axis of the guide changes.

The term "tilt", "tilting", or "tilting motion" is also used herein to refer to the motion of an inner part of a spacer in an associated recess within the outer part of the same spacer, in which the inner part is received, where the angle between an axis of the inner part and the axis of the outer part changes.

The expression "vertical motion" is used herein to refer to the motion of spacer in relation to the guide, in direction towards or away from the chamber.

The expression "vertical motion" is also used herein to refer to the motion of an inner part of a spacer in relation to the outer part of the same spacer, in a direction towards or away from the chamber.

The term "chamber" within the context of the present disclosure means the chamber operable to receive the pressure transmission medium. The term "chamber" and "pressure chamber" have the same meaning in the present disclosure.

The expression "high pressure" for the pressure transmission medium means a pressure of more than 101325 Pa.

The expression "high pressure" when used in relation to sealing components indicates that the sealing components (for example o-rings) are nominally suitable to be used with a fluid (such as a gas) under high pressure.

The expression "high temperature" means a temperature which is at least the service temperature, which is preferably equal to or above 120° C.

The term "holder" as used herein refers to a holder for the semiconductor device. In contrast, a holder for a protection film or a bottom protection film is explicitly stated as such.

The apparatus according to the invention is suitable for processing a semiconductor device. The method according to the invention is suitable for processing a semiconductor device.

A semiconductor device according to the invention may include at least one of a semiconductor die and a semiconductor substrate. A semiconductor die is a block of semiconductor material which may include a circuit. The semiconductor substrate may also comprise connection wires. The semiconductor substrate may itself comprise a circuit, itself being a semiconductor die. The semiconductor device after processing may be referred to as a final semiconductor device.

The term "device" and "semiconductor device" have the same meaning in the context of the present disclosure.

To simplify the explanation of the invention, reference is made to a semiconductor device. However the present disclosure applies equally to a plurality of semiconductor devices, thus, the apparatus and the method are suitable to process a plurality of semiconductor devices.

Processing a semiconductor device according to the invention includes applying pressure to the semiconductor device, preferably while maintaining the semiconductor device at the service temperature.

The service temperature may be selected to be higher than ambient temperature, preferably from about 120° C. to about 300° C.

In one preferred embodiment, the processing of the semiconductor device may comprise a step of pressing the semiconductor device.

In another preferred embodiment, the processing of the semiconductor device may comprise a step of molding. Alternatively or in addition, the processing of the semiconductor device may comprise a step of sintering.

In a further preferred embodiment, the processing is done while the top surface of the semiconductor device (facing the spacer) is covered by the spacer, such that the molding material, such as an encapsulant, would not completely cover the top of the semiconductor device after molding.

The present apparatus may be used for a semiconductor encapsulation process wherein a high pressure, as a sealing force, is applied across the top surface of a semiconductor die in order to ensure that the molding is performed consistently. Furthermore, the present apparatus and method are especially advantageous when used to process a plurality of semiconductor dice with different die thicknesses and die tilt angles, to improve consistency in molding the plurality of semiconductor dice. The present apparatus and method may be used to produce semiconductor devices where the top surfaces are at least partially exposed, for example MEMS sensor packages and fingerprint sensor packages.

FIG. 1 shows a cross-sectional side view of the apparatus 1 according to a first embodiment of the present invention. The apparatus 1 comprises a first tool 100 and a second tool 200, moveable relative to each other between an uncoupled state and a coupled state. In FIG. 1, they are shown in the uncoupled state. The second tool 200 comprises a holder 208 for receiving a semiconductor device 400. The first tool 100 comprises a pressure application component 309, which includes a pressure chamber 310 and a spacer 120 moveable in a guide. The guide is delimited by the adjacent guide wall 150. In the coupled state, the pressure chamber 310 may be configured to apply a force as a first pressure to the spacer 120, and the spacer 120 is configured to transmit the force, as a second pressure, to the semiconductor device 400. The first tool 100 comprises a gap 118 between the spacer 120 and the guide (represented by the guide walls 150 in the figures), where the gap 180 is configured to allow the spacer 120 to tilt in relation to the guide. Depending on the design of the spacer 120 (as explained below), the first pressure may be the same as or different from the second pressure.

Gap

The guide may be formed as a through-hole in a plate, wherein the plate is included in the first tool 100. The guide may therefore, be defined by the guide walls 150 of the through-hole. Thus, the guide preferably has a fixed position in relation to the plate, and preferably has an essentially fixed position (that is essentially not moveable) relative to the first tool 100.

The spacer 120 may be formed as an element that is sized to fit into the guide. The spacer preferably conforms to the shape of the guide, but leaving a gap between the spacer and the guide.

The gap allows the spacer to tilt in the guide, thus being able to adjust to the top surface of the semiconductor device which may be sloping, for example due to die tilt. Thus, the spacer has a certain angular freedom and lateral displacement freedom to conform to the sloping angle of the top surface of the semiconductor device.

The gap width may be determined by taking the sum of the distances between the spacer 120 and the guide along a cross section. In an example where the spacer 120 is a cylinder and the guide is a cylindrical hole, the gap width is the difference between the diameter of the guide and the diameter of the cylindrical hole.

The gap width may also be determined by taking a distance which is parallel to a planar surface of the guide.

In one embodiment, the gap is smaller at the end of the spacer 120 that is proximal to the pressure application component 309 than at the end of the spacer 120 that is distal to the pressure application component 309. Thus, allowing for a larger lateral motion of the spacer at the end that is further from the pressure application component 309, while keeping the stress on the pressure application component 309 (for example a diaphragm) at a minimum. The end of the spacer that is proximal to the pressure application component 309 is illustrated in FIG. 1 as end 125. The end of the spacer that is distal from the pressure application component is illustrated in FIG. 1 as end 126.

The width of the gap between the spacer and the guide is preferably from about 0.001 mm to about 5 mm. In cases where the gap has different widths in different directions, the width in at least one direction may be from about 0.001 mm to about 5 mm. Preferably, the width in all directions may be from about 0.001 mm to about 5 mm. The directions are parallel to the planar surface of the guide which is proximal to the pressure application component 309.

The width of the gap, at the end of the spacer that is proximal from the pressure application component 309 is from about 0.001 mm to about 1 mm, preferably about 0.001 mm to about 0.02 mm, and further preferably from about 0.0095 mm to about 0.015 mm. Such a small gap width is preferred as it minimizes the stress on the pressure application component 309. In cases wherein the gap has a different width in one direction compared to another direction, the width in at least one direction may satisfy these ranges. Preferably, the widths in all directions satisfy these ranges. The directions are parallel to the planar surface of the guide which is proximal to the pressure application component 309. For example, if the top view cross section of spacer and guide is rectangular, then the gap may include a first gap width on the shorter side of the rectangle and a second gap width on the longer side of the rectangle. The first and the second widths may each be from about 0.001 mm to about 1 mm, preferably about 0.001 mm to about 0.02 mm, and further preferably from about 0.0095 mm to about 0.015 mm.

The width of the gap, at the end of the spacer that is distal from the pressure application component 309 and proximal to the semiconductor device 400 is from about 0.01 mm to about 5 mm, preferably about 0.02 mm to about 0.1 mm, and further preferably from about 0.045 mm to about 0.055 mm. In cases wherein the gap has a different width in one direction compared to another direction, the width in at least one direction may satisfy these ranges. Preferably, the width in all directions may satisfy these ranges. The directions are parallel to the planar surface of the guide which is proximal to the pressure application component 309.

In the case wherein the gap width may depend on the relative position between the spacer and the guide, the preferred width of the gap is the width of the gap when the apparatus 1 is in the coupled state.

Spacer

The spacer may include a first surface and a second surface, wherein the first surface is the surface configured to contact the pressure application component 309 such as a diaphragm, and wherein the area of the first surface is larger than the area of the second surface, so that the pressure applicable by the spacer when fully utilizing the second surface is larger than the pressure applied by the pressure application component 309 to the first surface. Therefore, a large pressure can be applied to the device, while keeping the pressure between the diaphragm and the spacer low to minimize the wear on the diaphragm and thus extend the lifetime of the diaphragm.

The first surface is proximal to the pressure application component 309 and distal from the semiconductor device 400. The second surface is distal from the pressure application component 309 and proximal to the semiconductor device 400.

The spacer and guide may have complementary geometric shapes, however with different dimensions, so that the guide can accommodate the spacer and provide the required gap. For example, both can be in the shape of a frustum of a cone (truncation plane parallel to the base) with slightly different dimensions.

It is preferred that the spacer's surface for contacting the semiconductor device has an essentially regular polygonal geometry or a rectangular geometry.

The geometry of the guide and the spacer may be configured such that, the area of the first surface (proximal to the pressure application component 309) of the spacer is larger than the area of the second surface of the guide which is distal from the pressure application component 309. The areas of the openings of the guide are sized to receive the spacer. This satisfies various embodiments of the invention and further limits the vertical motion of the spacer within the guide. As an example, such combination could be achieved by selecting a geometry of the spacer and guide which may be a truncated cone, truncated pyramid, frustum, frustum of a cone, or right frustum (truncated right pyramid).

The edges of the spacer, including the edges that are at the end of the spacer proximal to the pressure application component 309 and the edges that are at the end of the spacer distal from the pressure application component 309, are preferably deburred, with rounded edges of radius of 0.2 mm or less. It is preferred that all edges of the spacer are deburred.

The deburring of the spacer and/or guide at the end proximal to the pressure application component 309 has surprisingly been found to increase the lifetime of the pressure application component 309, such as a diaphragm. The stress on the diaphragm can be further lowered when the edges are deburred and the gap is kept small, preferably within the ranges as described above.

The apparatus may also include spacer resilient members 901 (shown in FIG. 7) such as springs located within the gap between the spacer and the guide wall. The spacer resilient members 901 are useful for applying a returning force to the spacer and the guide wall in order to return the spacer from its tilted position relative to the guide wall in the coupled state, back to its original position in the guide in the uncoupled state. The spacer resilient members 901 are operable to exert a relatively small force compared to the forces compelling the spacers to tilt in the coupled state, such that returning force would not be sufficient to prevent the spacers from tilting and yet be sufficient to return the spacer to its original position in the guide in the uncoupled state. Hence, the contact forces in the coupled state overcome the returning force exerted by the spacer resilient members 901 to tilt the spacer. However, in the uncoupled state when the contact forces are removed, the returning force exerted by the spacer resilient members 901 return the spacer to its original position in the guide.

Pressure Application Component

The pressure application component 309 is configured to apply a uniform pressure onto the plurality of spacers. The pressure application component 309 may be a pressure pad. The pressure application component 309 may be a sealed pressure pad. Alternatively, the pressure application component 309 may be a pressure pad connected to a duct for a pressure transmission medium.

The pressure application component 309 may include a chamber, for example a chamber in a body or housing. The chamber may comprise a diaphragm. The chamber may include an incompressible material as a pressure transmission medium constrained within the chamber by the diaphragm. The incompressible material may be solid or liquid. In the coupled state of the apparatus, the incompressible material may transmit the isostatic pressure to the spacer. Alternatively or in addition to relying upon isostatic pressure exerted by the incompressible material, the body may include a duct for fluids to flow into the chamber. When the body includes a duct for fluids, the pressure transmission medium may be a fluid material, such as a liquid or a gas, preferably an inert gas. It was surprisingly found that an inert gas increases the lifetime of the diaphragm because the use of an inert gas helps to prevent oxidation of the diaphragm. The inert gas preferably includes at least one of nitrogen or argon.

Examples of incompressible materials would be materials with very low shear modulus, such as liquid, gel, or solid silicone material. Under high pressure the incompressible material will transmit the isostatic pressure to all spacers and through the spacers to the semiconductor devices 400. The small gap between the spacer 120 and the guide wall 150 minimizes the stress on the elastic diaphragm thus reducing the chances of the diaphragm breaking or rapturing.

The invention preferably includes a diaphragm, the diaphragm preferably includes an elastic film. The diaphragm prevents any extrusion of the pressure transmission medium into the gap between the spacer and the guide, and provides stroke flexibility for the spacer's vertical motion and tilting motion. In this case the force provided by the apparatus will be transmitted via the pressure transmission medium, the diaphragm and the spacers 120 to the semiconductor devices 400.

The preferred thickness range of the elastic film included in the diaphragm is from about 1 μm to about 1 mm.

The preferred tensile strength range of the elastic film at 250° C. is from about 1 M Pa to about 1000 M Pa. The tensile strength is preferably determined according to ASTM D-882.

The preferred tensile modulus of the elastic film at 250° C. is from about 0.1 G Pa to about 10 G Pa. The tensile modulus is preferably determined according to ASTM D-882.

The elastic film material used for the diaphragm may be selected from at least one of: PTFE (Polytetrafluoroethylene), PFA (perfluoroalkoxy), PI (Polyimide), PAEK (Polyaryletherketone), PEEK (Polyetheretherketone), PEI (Polyetherimide), PESU (Polyethersulfone), PPS (Polyphenylene sulfide), PPSU (Polyphenylsulfone), PVDF (Polyvinylidene fluoride).

In one preferred embodiment, the body is a diaphragm cartridge. A cartridge can be easily replaced if at least one of its components needs to be replaced, for instance when the diaphragm has reached its expected life cycle.

FIG. 1 shows an example of the invention in which the pressure application component 309 includes a diaphragm 111 separating a pressure transmission medium in the pressure chamber 310 from the spacer 120. The diaphragm is an elastic diaphragm. The diaphragm may include other parts that are not necessarily elastic. The skilled person in the art will understand from the present disclosure that the elasticity of the diaphragm allows effective and uniform transmission of pressure to the spacer, and the diaphragm to effectively conform to the uneven surfaces of the spacer 120 and the guide. However, a diaphragm directly contacting the top surface of a semiconductor device under high pressure and high temperature processing conditions may cause the diaphragm to rapture due to its contact with the sharp edges of the semiconductor devices. The spacer 120 provided between the semiconductor devices and the diaphragm helps to overcome this issue. The spacer 120 and its guide each has a well-controlled dimension for maintaining a defined gap, and both have burr-free surfaces and edges.

The apparatus 1 may include a protection film 300 over the holder and semiconductor device 400 for protecting the semiconductor device 400 during contact with the spacer 120, as shown in FIG. 1.

The elastic diaphragm may include a film of polymer material or a composite thin film.

The elastic diaphragm may function to isolate the pressure transmission medium from the spacer.

The pressure application component 309 may include a high temperature and/or high pressure elastomer sealing to isolate the pressure chamber from the external environment. Preferably the sealing is suitable for high temperature and high pressure. Such sealing may be an o-ring. The sealing prevents leakage of the pressure transmission medium from the chamber. In one further development of the invention, the pressure application component 309 may include an additional ring, wherein the additional ring is arranged around the o-ring. The additional ring is preferably a wedge shaped ring. The wedge shaped ring may prevent the extrusion of the o-ring due to the high pressure in the pressure chamber.

Advanced Spacer

In one further embodiment of the invention, the spacer includes an inner part and an outer part. Preferably the inner part is movable in relation to the outer part, thus allowing for relative vertical and angular movements between the inner part and the outer part. This permits the exertion of different forces on different portions of the semiconductor device. For example, the semiconductor device may comprise a semiconductor substrate and a semiconductor die, the outer part can exert pressure on the semiconductor substrate and the inner part can exert pressure on the semiconductor die. An additional gap between the inner part and the outer part allows for tilt compensation of the semiconductor substrate or die, and at the same time for the compensation of planarity deviations between the semiconductor substrate and the semiconductor die.

The spacer according to the invention may also comprise two or more inner parts and one outer part. This may be useful, for example, if two semiconductor dice need to be processed onto a semiconductor substrate, then each inner part exerts pressure on one respective semiconductor die and the outer part exerts pressure on the substrate, thus homogeneous or different forces can be applied on different portions of the semiconductor device. The inner and outer parts also allow for adjustment of the ratio of the forces exerted on the die and the pressure on the substrate, for example by adjusting the areas of the inner and outer parts contacting the semiconductor device.

In one preferred version of this further embodiment of the invention, the motion of the inner part in relation to the outer part is restricted in the direction away from the pressure application component 309 and towards the semiconductor device to a pre-defined position. Further preferably, the inner part can only be moved until the distal end is aligned with the distal end of the outer part. The distal end refers to the end that is distal to the pressure application component 309. In one version, the inner part may be moved towards the pressure application component 309 more than the outer part, however, the outer part may not be moved towards the pressure application component 309 more than the inner part.

The geometry of the inner part and the receptacle part of the outer spacer for receiving the inner spacer may be configured such that, the area of the first surface (proximal to the pressure application component 309) of the inner part is larger than the area of the receptacle part which is proximal to the pressure application component 309. This satisfies various embodiments of the invention and further limits the vertical motion of the inner part within the outer part (receptacle). As an example, such combination could be achieved by selecting a geometry for the inner part and the receptacle from the same of a: truncated cone, truncated pyramid, frustum, frustum of a cone, right frustum (truncated right pyramid).

Protection Films and Carrier

The holder includes a surface capable of receiving the semiconductor device, directly or on a support, where the support may be a carrier for carrying or holding the semiconductor device or a protection film.

The apparatus may include a protection-film holder, such as a cartridge, such that the film may be arranged between the second and the first tool, and between the spacer and the semiconductor device. The first tool may be operative to receive the protection-film holder. The first tool may be operative to receive the protection film. The protection film protects the semiconductor device and prevents the extrusion of encapsulating material into the gaps between the spacer and the guide. The protection film is preferably a flexible layer.

The second tool 200 is operative to receive a carrier for carrying the semiconductor device. The carrier may be suitable to be placed over the holder. It is preferred that the carrier is selected so that the coefficient of thermal expansion (CTE) is compatible with the CTE of the semiconductor device, for example compatible with the CTE of Si if the substrate of the semiconductor device includes Si. The term "compatible" means that the CTE is the same or substantially the same as of the semiconductor device. The CTE of the carrier may also be selected to be compatible with the CTE of the holder and the CTE of the semiconductor device. The difference between the CTE of the carrier and the CTE of the substrate may be from about 0 ppm/° C. to about 5 ppm/° C. A compatible CTE may reduce the internal stress generated in the semiconductor device when pressing on the semiconductor device while heating up the semiconductor device and the carrier. Alternatively or in addition, the second tool 200 is operative for receiving a bottom protection film, such as a film in a cartridge, such that the bottom protection film may be arranged between the second and the first tools, and between the holder and the semiconductor device. The bottom protection film protects the semiconductor device and a carrier may not be needed. The bottom protection film may be elastic. An elastic film may accommodate the difference in thermal expansion between the holder and the semiconductor device, therefore, a CTE matching between the holder and the semiconductor device may not be required.

The sintering temperature is typically 230° C. to 300° C., which is much higher than room temperature. When the device is placed and clamped onto the second tool 200, and while it is being heated up, the difference in the amount of thermal expansion between the semiconductor device and the second tool 200 may generate a large internal stress, since the friction on the interface between the semiconductor device and the second tool 200 would put stress on the semiconductor device. With a carrier comprising a CTE compatible with the CTE of the semiconductor device, there are minimal relative dimension changes at the interface and therefore less internal stress is generated within the device. With a bottom protection film, the bottom protection film can deform, preferably elastically, to accommodate the expansion of the semiconductor device, and thus reduce the device's internal stress.

It is preferred that the carrier has parallel surfaces.

In one embodiment of the invention, the apparatus includes the protection-film holder and the bottom-protection-film holder.

The preferred range of thickness of the elastic protection film and/or bottom protection film is from about 1 µm to about 1 mm.

The preferred tensile strength range of the elastic protection film and/or bottom protection film, at 250° C., is from about 1 M Pa to about 1000 M Pa. The tensile strength is preferably determined according to ASTM D-882.

The preferred tensile modulus of the elastic protection film and/or bottom protection film, at 250° C. is from about 0.1 G Pa to about 10 G Pa. The tensile modulus is preferably determined according to ASTM D-882.

The materials used for the elastic films for the protection film and/or bottom protection film are selected from at least one of: PTFE (Polytetrafluoroethylene), PFA (perfluoroalkoxy), PI (Polyimide), PAEK (Poly aryletherketone), PEEK (Polyetheretherketone), PEI (Polyetherimide), PESU (Polyethersulfone), PPS (Polyphenylene sulfide), PPSU (Polyphenylsulfone), PVDF (Polyvinylidene fluoride).

Holder

The holder of the semiconductor device may include a balancing component for balancing or leveling the surface of the holder, such that the angle of the surface, together with the tilt angle of the spacer, conforms to the top and bottom surfaces of the semiconductor device. In a preferred example, the holder includes, or is part of, a spherical bearing operative to rotate to level the semiconductor device in relation to the spacer, preferably when the apparatus is changed from the uncoupled state to the coupled state. Thus, an even pressure distribution on the surface of the semiconductor device may be achieved.

The holder may include a sensor for measuring the pressure applied on the holder. The sensor may be in the form of a sensor array, having one or more sensor devices per holder. The apparatus may include a recorder for recording the contact pressure or the contact force. This provides a traceability record of the manufacturing process, which is important for power electronics and/or automotive applications. The sensor may preferably be selected from: a pressure sensor, a force sensor.

While only one holder has been described above, the apparatus 1 may include a plurality of holders, such as 10 or more. The details and characteristics of the one holder described above equally apply to the plurality of holders. Preferably the plurality of holders is included in a holder block, which also may include the spherical bearings, and the sensors. The holder block can be moved as a single unit by the ejection mechanism.

One holder may be associated to one spacer. Alternatively, one holder may be associated to two or more spacers. The spacers may also each comprise respective inner and outer parts.

Ejection Mechanism

The apparatus may include a heat source, e.g. a heating element or a heating block. The heat source is preferably included in the second tool 200. It is further advantageous that the second tool 200 is configured such that the distance between the heat source and the holder is adjustable.

The second tool 200 may include an ejection mechanism, the ejection mechanism may be used to bring the holder or holder block, and thus the semiconductor device, in and out of thermal contact with a heat source. The ejection mechanism may be configured such that in a resting position it is not in contact with the heating source. The ejection mechanism, which may be supported by springs, may separate the holder from the rest of the second tool 200. When the apparatus is brought into the coupled state, the ejection mechanism is pressed against the remainder of the second tool 200, thus bringing the semiconductor device into thermal contact with the heat source. When the apparatus is brought into uncoupled state, the ejection mechanism may lift up the device for quicker cooling.

Figure 2:
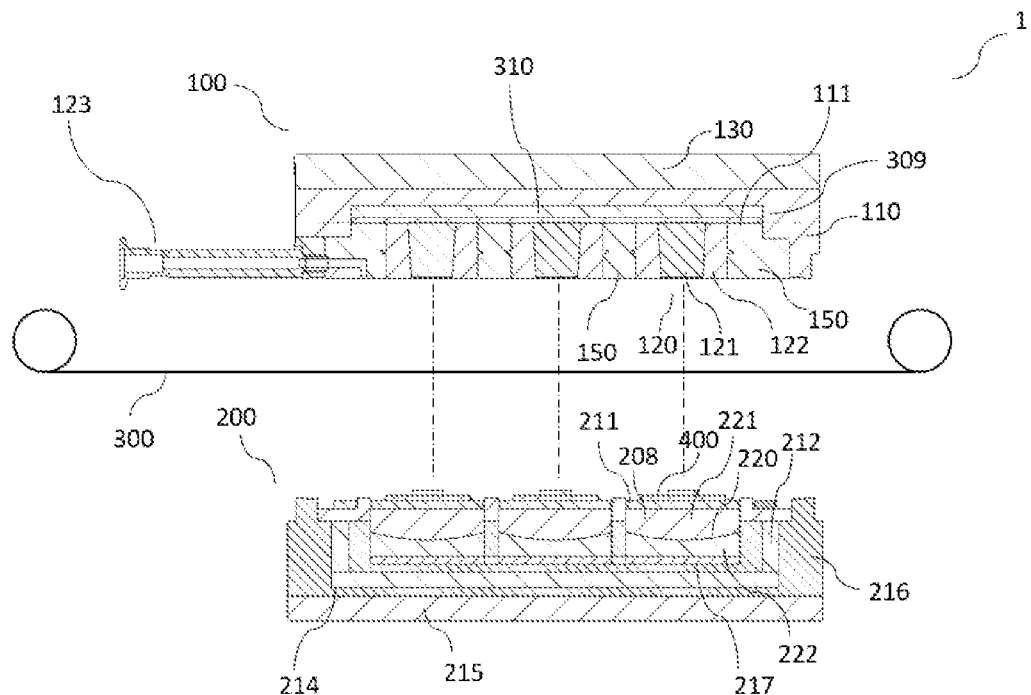
FIG. 2 shows a cross sectional schematic of an apparatus according to another embodiment of the present invention.

FIG. 2 shows an apparatus 1 including a first tool 100 and a second tool 200. The first tool 100 and the second tool 200 are configured to be moveable relative to each other between a coupled and an uncoupled state. The first tool 100 may include a duct 123 for the creation of vacuum or the introduction of a process gas or venting gas. Venting may be used to assist the uncoupling of the first tool 100 and second tool 200, and the creation of vacuum may be used to assist the coupling of the tools 100, 200.

The first tool shown in FIG. 2 includes a pressure application component 309, the pressure application component 309 includes a diaphragm cartridge 110 and a chamber 310. The diaphragm cartridge includes the diaphragm 111 at least partially lining the chamber 310. The chamber 310 may include a pressure transmission medium, preferably an incompressible material, which may preferably be solid or liquid. In the example of FIG. 2 the chamber may be closed by the diaphragm and may have no other opening for removing the pressure transmission medium. The spacer 120 includes, as an example, an outer part 122 and an inner part 121 as explained above under "Advanced Spacer". Alternatively, the spacer could be a single part. The spacer's guide is formed by the adjacent guide wall 150. The adjacent guide wall 150 is shown in the cross-sectional view to be on the left and right sides of the spacer 120. The guide comprising the adjacent guide wall 150 preferably surrounds the spacer 120 along its sides, enabling the vertical motion of the spacer 120. FIG. 2 shows, by means of example, three sets of spacer and guide, the invention however is not limited to three, and may comprise more, such as 10 or more spacers, each in a corresponding guide. FIG. 2 also shows that the first tool 100 may comprise a mounting plate 130.

The second tool 200 shown in FIG. 2 includes a holder 208 for receiving a semiconductor device 400. As an example, the second tool 200 of FIG. 2 may include a carrier 211 for supporting the semiconductor device 400 on the holder 208. There may be one holder 208 associated with one spacer 120, or one holder 208 associated with two or more spacers.

As shown in FIG. 2, the second tool 200 may comprise a bottom mounting plate 215. The holders 208 may be separable from a heating source, which heating element may be included in the bottom mounting plate 215. For example, the holders may be thermally disconnected from the heating source via an ejection mechanism 214 which may, for example, be operated by an optional ejection pin 212. The ejection mechanism 214 has springs which are operative to lift up the device carrier 211 and semiconductor device 400 to form an air gap so that direct contact between the bottom tool 200 and the semiconductor device 400 is prevented. On the other hand, when the first and second tools 100, 200 are coupled, the springs will be compressed so that the device carrier 211 and semiconductor device 400 are clamped and in contact with the second tool 200 for heating the semiconductor device 400 via conductive heat transfer. By selectively separating or coupling the holders from the heat source, the holders may be thermally contacted to the heating source only for the time needed for heating the semiconductor device 400, therefore avoiding excessive heat exposure. As shown in FIG. 2 the second tool 200 may also include a thermal insulation block 216.

As an example shown in FIG. 2 the semiconductor device 400 has a semiconductor substrate and semiconductor die (the smaller part shown over the substrate). The semiconductor device may be of diverse parts and arrangements. In a case where pressure needs to be applied to both a semiconductor substrate and an additional smaller area, such as a semiconductor die, the use of a spacer comprising an inner and outer part offers advantages, as it allows for better force distribution on the semiconductor device.

As also shown in FIG. 2, the holder may comprise a sensor 217 for example for measuring the pressure applied on the holder. The sensor 217 may be in form of a sensor array, having one or more sensor devices per holder.

With reference to FIG. 2, the apparatus 1 may include a protection-film holder, such as a film in a cartridge where the protection film 300 may be arranged between the second tool 200 and the first tool 100, and between the spacer 120 and the semiconductor device 400. The first tool 100 may be operative to receive the protection-film holder. The first tool 100 may be operative to receive the protection film 300.

When the first tool 100 and the second tool 200 are coupled, and pressure is exerted, the spacer 120 contacts the semiconductor device 400 and conforms to the top surface of the semiconductor device 400. The first tool 100 comprises a gap (refer to gap 118 in FIG. 1) between the spacer 120 and the guide. The gap (not shown in FIG. 2) allows the spacer to tilt, thus conforming to even very small unleveled or non-parallel surfaces of the semiconductor 400. The pressure application component 309 ensures a uniform pressure or force may be applied to the spacer 120. When the spacer 120 includes an inner part 121 and an outer part 122, as shown in FIG. 2, the spacer 120 can further conform to different portions of the semiconductor device 400. For example, the inner part 121 may contact the semiconductor die and the outer part 122 may contact the semiconductor substrate.

Figure 3:
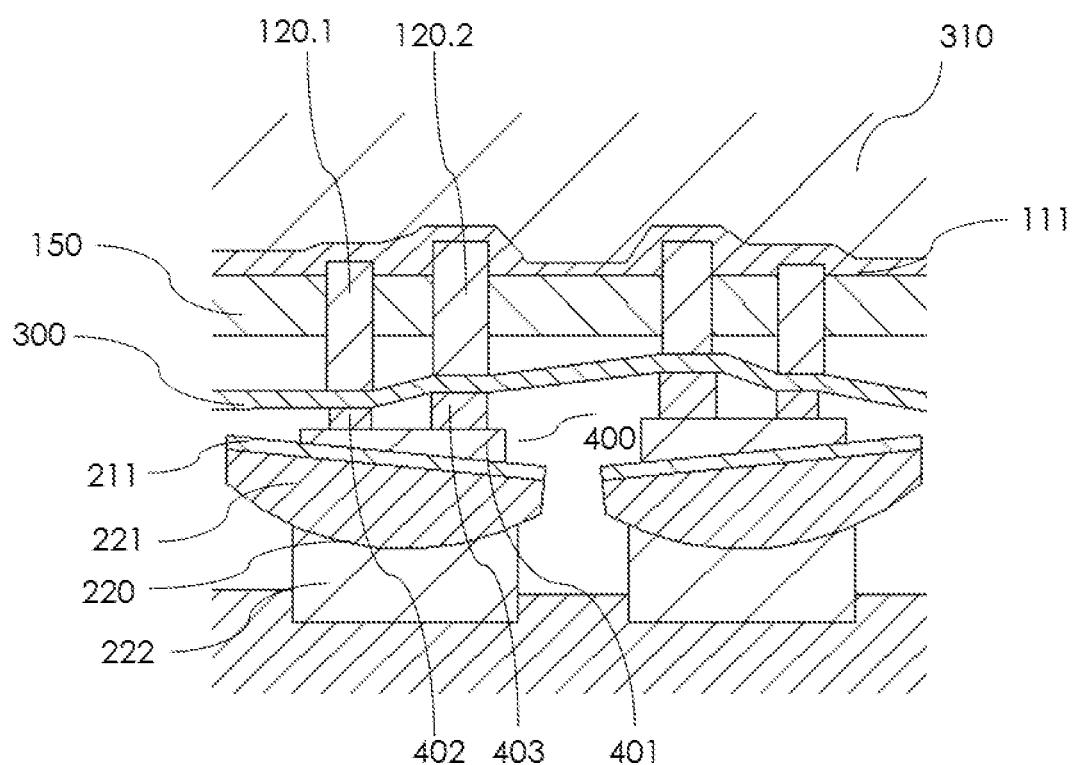
FIG. 3 shows a cross sectional schematic of a part of an apparatus similar to FIG. 2, in which there are two spacers for a single substrate, each spacer positioned above a corresponding semiconductor device.

The holder 208 may include or may be part of a spherical bearing 220 for balancing the surface of the holder, thus leveling the top surface of the semiconductor device 400. A magnified schematic view on the effect of the means 220 for balancing the surface of the holder is given in FIG. 3, with the example of a spherical bearing. In the example, the semiconductor 400 includes a semiconductor substrate 401, a semiconductor die 402 and an additional semiconductor die 403. In order to explain the function of the spherical bearing 220, two spacers 120.1 and 120.2 are shown, each spacer for one of the semiconductor dice 402, 403 respectively. Referring to the left side of FIG. 3, it can be seen that the semiconductor substrate 401 has upper and lower surfaces (upper is proximal to the spacer and lower is proximal to the holder) which are not parallel to each other. The balancing component, in this case a spherical bearing, adjusts the top surface of the semiconductor device by moving the top part 221 in relation to the bottom part 222, such that the top surface of the semiconductor substrate 401 or the top surfaces of the semiconductor dice 402, 403 (depending on which is intended) are substantially parallel to the upper part. This balancing may take place for example when coupling the upper part to the lower part. In the example of FIG. 3 the die 402 and the die 403 have different heights, for example due to different thicknesses. Due to the pressure application component 309, the first spacer 120.1 and the second spacer 120.2 are able to apply the same pressure on the semiconductor device 400. Because two spacers are used, the different heights of the dice can be processed. Each spacer 120.1 and 120.2 has a respective gap from its corresponding guide (gap not shown), the gaps allow each spacer 120.1 and 120.2 to tilt and adapt itself to the respective surface angle of the corresponding dice 402 and 403. The right side of FIG. 3 shows the configuration of a similar set of spacers 120.1, 120.2 and holder 208 compensating for the different thickness of the semiconductor dice 402, 403 and non-parallel surfaces of the semiconductor substrate 401. It can be seen that the spacers 120.1, 120.2 and the spherical bearing 220 can easily adapt to different die thicknesses and semiconductor surfaces.

Due to the isostatic nature the low tensile modulus of the diaphragm, even if the semiconductor device has different thicknesses, for instance due to the semiconductor dice 402, 403 having different thicknesses, the pressure distribution on the elastic diaphragm remains intrinsically uniform. Therefore, the uniformity of the forces applied by the transmission spacers 120.1, 120.2 to the semiconductor dice 402, 403 is high. Thus the differences in device thickness are compensated, and highly reproducible and consistent final semiconductor devices may be made. Therefore, the apparatus enables multiple degrees of freedom for conforming to the semiconductor device 400 and provides a uniform application of pressure.

Figure 4:
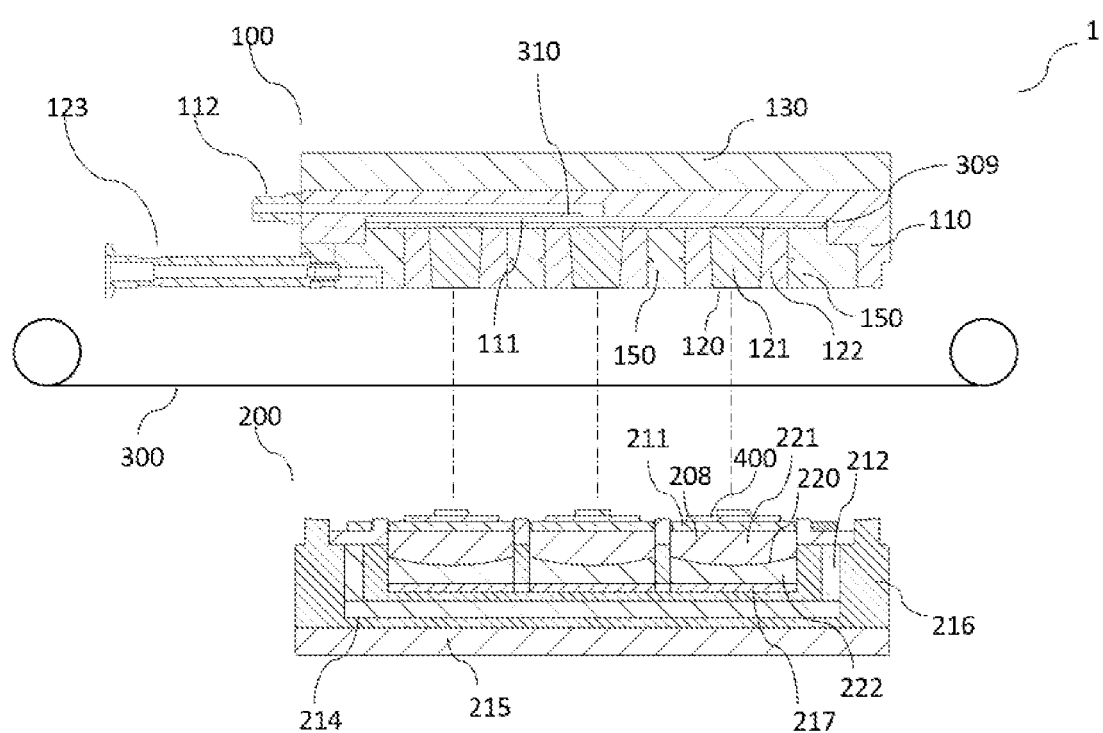
FIG. 4 shows a cross sectional schematic of the apparatus similar to FIG. 2 but with a different pressure application component.

FIG. 4 shows a similar example as in FIG. 2, with the exception that the first tool 100 includes a duct 112 connecting to the chamber 310. The first tool 100 may include an inlet connected to the duct 112. The pressure transmission medium may be a fluid, such as a liquid or a gas. The pressure transmission medium may fill the chamber and the pressure may be applied and/or controlled externally via the duct 112 and the inlet.

Figure 5:
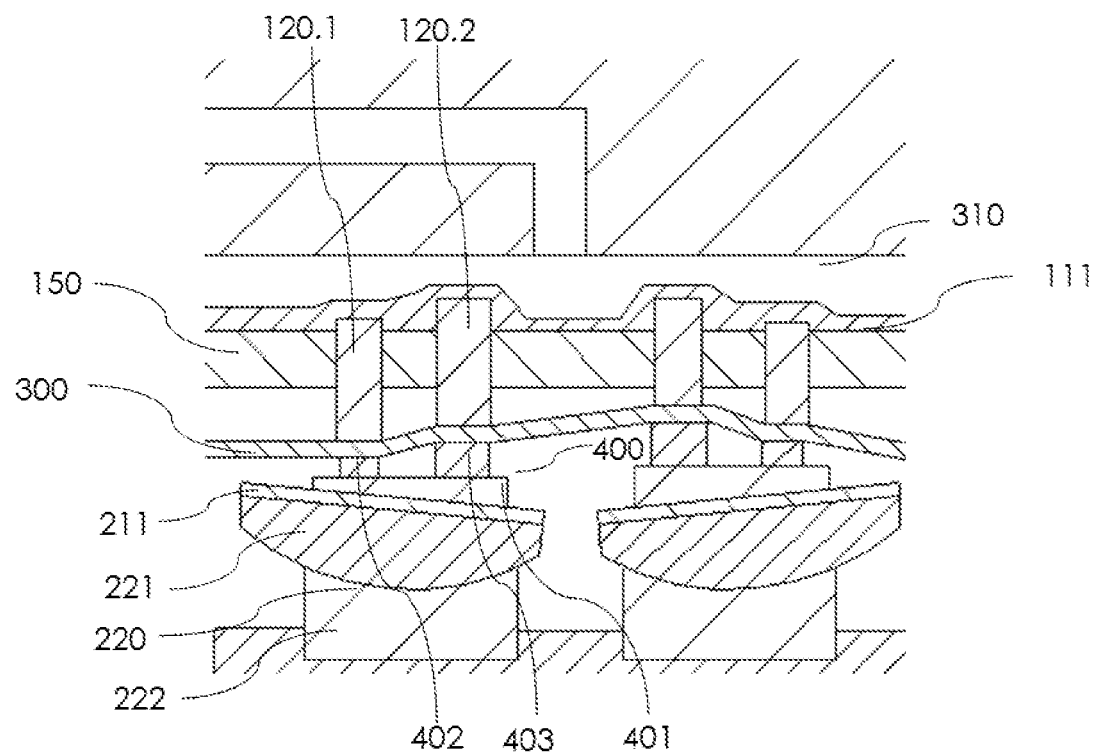
FIG. 5 shows a cross sectional schematic of an apparatus similar to FIG. 3, in which there are two spacers for a single substrate, each spacer positioned above a corresponding semiconductor device.

FIG. 5 shows a similar example as in FIG. 3, with the exception that a duct 112 is present and the diaphragm 111 may be contacting a liquid or gaseous pressure transmission medium.

Figure 6:
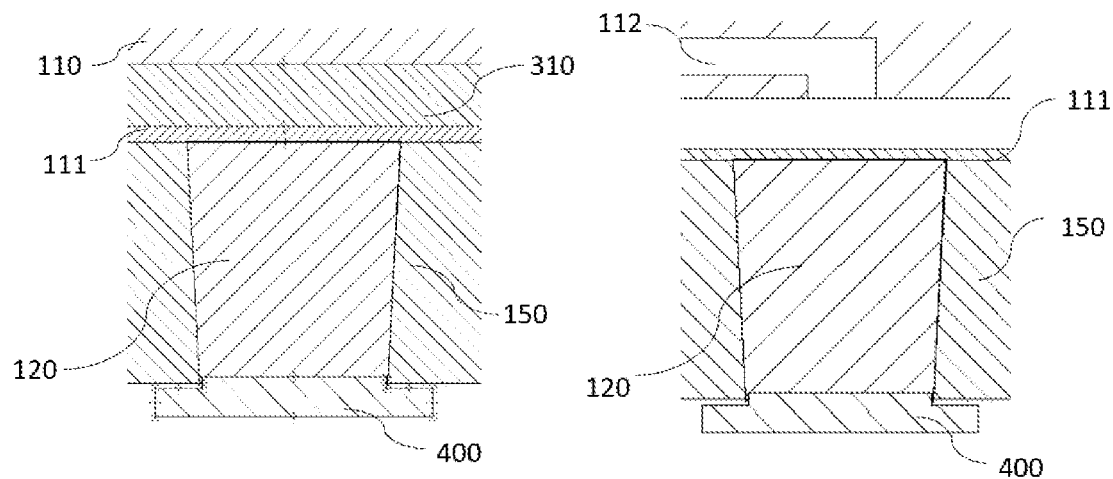
FIG. 6 shows a schematic cross sectional view illustrating details of the contact between a diaphragm and a spacer, and an exemplary embodiment of the spacer.

FIG. 6 shows a schematic cross sectional view of a detail of the spacer 120, on the left side for the case where an incompressible pressure transmission medium is used and at the right side with a duct 112 for introducing fluids as the pressure transmission medium. FIG. 6 shows, in an illustrative manner, the contact between the diaphragm 111 and spacer 120 at the end of the spacer which is proximal to the pressure application component 309. FIG. 6 also shows the contact between the spacer 120 and the semiconductor device 400 at the end of the spacer which is distal from the pressure application component 309. In one embodiment of the invention, as illustrated in FIG. 6 by way of example, the area of the end of the spacer 120 which is proximal to the pressure application component 309 is larger than the area at the end of the spacer 120 which is distal from the pressure application component 309. In that case, a mechanical advantage is easily achieved since the pressure applied on the semiconductor device 400 can be higher than the pressure applied by the diaphragm 111 on the spacer 120. Hence, the stress on the diaphragm 111 can be reduced thus increasing the usable lifetime of the diaphragm 111. For example, if the proximate end of the spacer's surface area is 2 times of the distal end of the spacer's surface area, then applying a pressure of 25 M Pa on the diaphragm 111 will result in 50 M Pa pressure on the semiconductor device 400.

Figure 7:
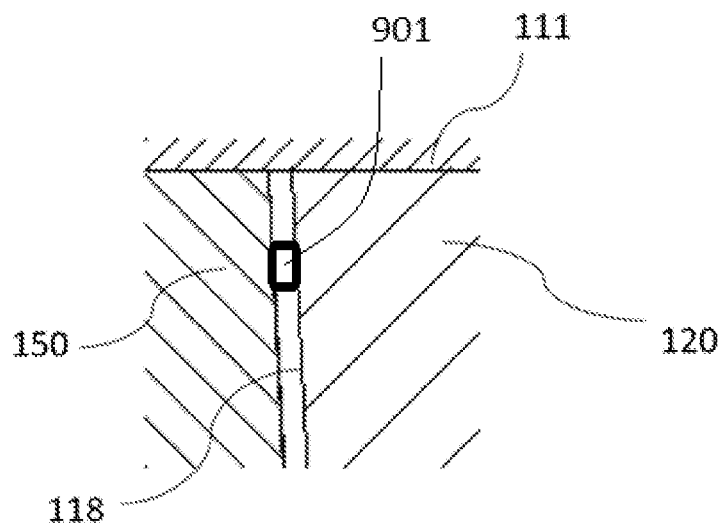
FIG. 7 shows a schematic cross sectional view illustrating details of the contact between the diaphragm and spacer.

FIG. 7 emphasizes the gap 118 between the spacer 120 and guide wall 150. FIG. 7 also shows the spacer resilient member 901 located within the gap 118 between the spacer 120 and guide wall 150.

Figure 8:
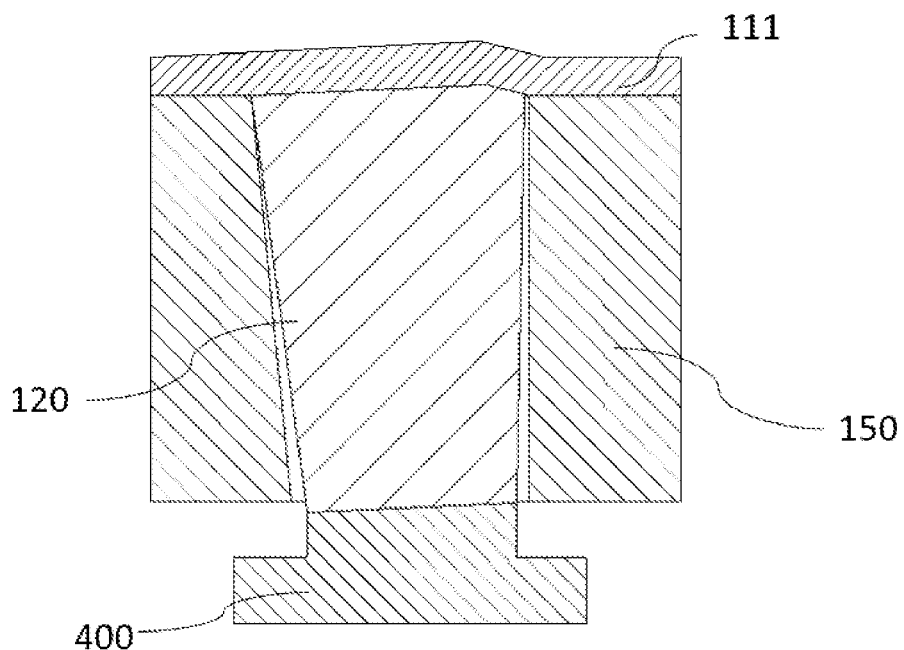
FIG. 8 shows in a schematic cross sectional view of how an unleveled surface of the semiconductor device may be compensated by the spacer.

FIG. 8 shows as a schematic illustration, a spacer 120 in the guide between the guide walls 150 in contact with a diaphragm 111 (at the proximal end) and in contact with a semiconductor device 400 (at the distal end). It is shown that the gap at the proximal end is smaller than the gap at the distal end. This allows for a wider angular motion or larger tilting motion of the spacer at the distal end, while at the same time minimizing the stress on the diaphragm. FIG. 8 emphasizes the position that the spacer 120 assumes within the guide (limited by the guide walls 150), when conforming to the top surface of a semiconductor device 400. For illustration purposes, the semiconductor device 400 is shown as having exaggerated non-parallel surfaces. The schematic is exaggerated and not drawn to scale in order to facilitate the explanation.

Figure 9:
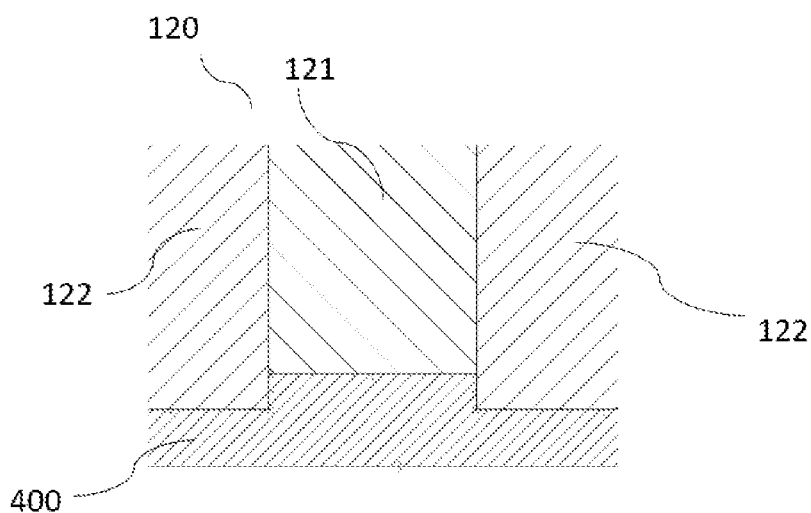
FIG. 9 shows, in a schematic cross sectional view, details of the contact between a spacer and the semiconductor device at two different heights of the semiconductor device, according to a further development of an embodiment of the invention.

FIG. 9 is a schematic illustrating the partial detail of a spacer 120 including an inner part 121 and an outer part 122. The inner part 121 is movable in relation to the outer part 122. This allows for the exertion of pressure on different levels of the semiconductor device 400. In the illustrated example, the semiconductor device 400 may comprise a semiconductor substrate contacted by the outer part 122 and a semiconductor die embedded between the substrate and the inner part 121. The outer part 122 exerts pressure on the semiconductor substrate and the inner part 121 simultaneously exerts pressure on the semiconductor die. The use of the spacer 120 comprising the inner part 121 and the outer part 122 helps to overcome any warpage of the semiconductor device being processed.

Figure 10:
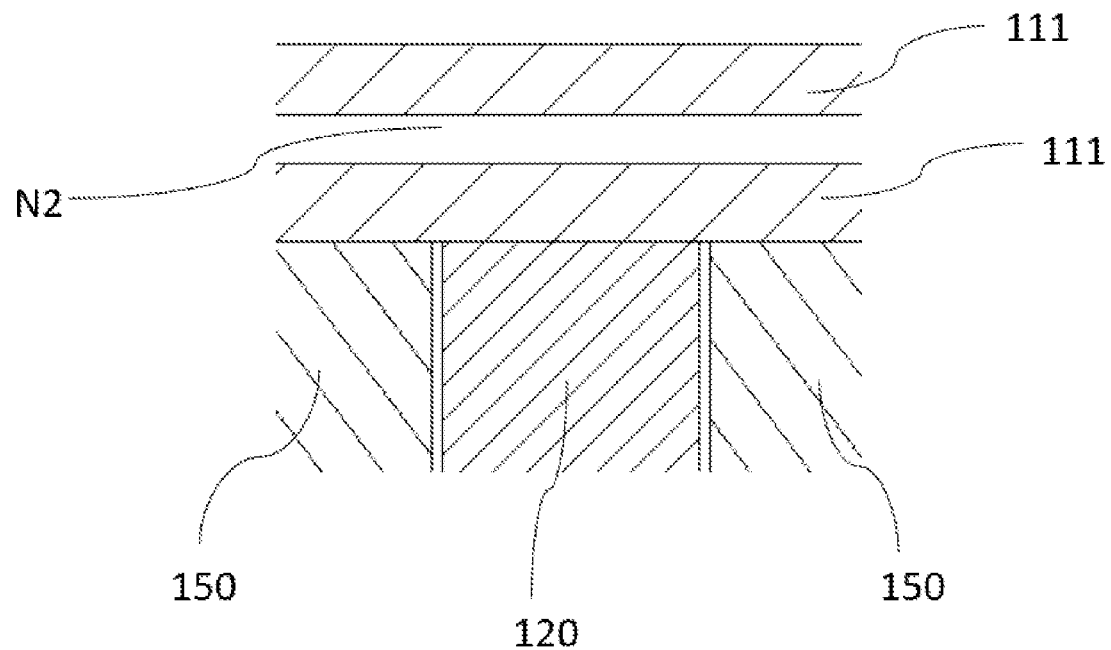
FIG. 10 shows, in a schematic cross sectional view, details of the contact between a diaphragm and a spacer, and a further development of the diaphragm.

In a further development of the invention, the diaphragm includes at least two layers. The double layer structure is less prone to failure since a defect (for instance crack or rupture) in one of the layers may not transmit to the other layer. In yet a further development of the invention, the diaphragm is configured to include a fluid, preferably a gas, injected between the two layers, and a pressure measurement device may be used to detect any leakage. The gas is preferably an inert gas. FIG. 10 is an exemplary schematic view of part of a diaphragm and spacer 120 in the guide delimited by the guide walls 150. FIG. 10 illustrates, by way of example, that nitrogen may be injected between the two layers 111, and the pressure measurement device may be used to test for any leakage. Therefore, a single defective layer can be detected at an early stage. Thus, a user can be warned to replace the diaphragm, and a complete malfunction of the diaphragm can be avoided. With the double layer structure, safety and long service lifetime can be maintained. The apparatus may comprise a component configured for carrying out leakage detection from time to time, for example, between processing operations.

In a further development of the invention the diaphragm layer contacting the spacer is thermoformed. The thermoforming is preferably carried out in-situ, such that the diaphragm layer conforms to the spacers in their position in a coupled state of the apparatus. The thermoforming provides for a diaphragm that, after being thermoformed by the spacer, includes a matching surface profile for receiving the spacer. The thermoforming may be carried out by heating the first tool 100 such that the diaphragm 111 achieves the suitable temperature for the layer contacting the spacer to be thermoformed, and then applying pressure to the diaphragm, for example in a coupled state of the apparatus, with or without dummy semiconductor devices, and subsequently by reducing the temperature to a temperature below the thermoforming temperature, and releasing the pressure. When the thermoforming is carried out in-situ, a heat source within the apparatus may be used for heating the first tool 100 and the diaphragm 111 layer, up to the thermoforming temperature.

Figure 11:
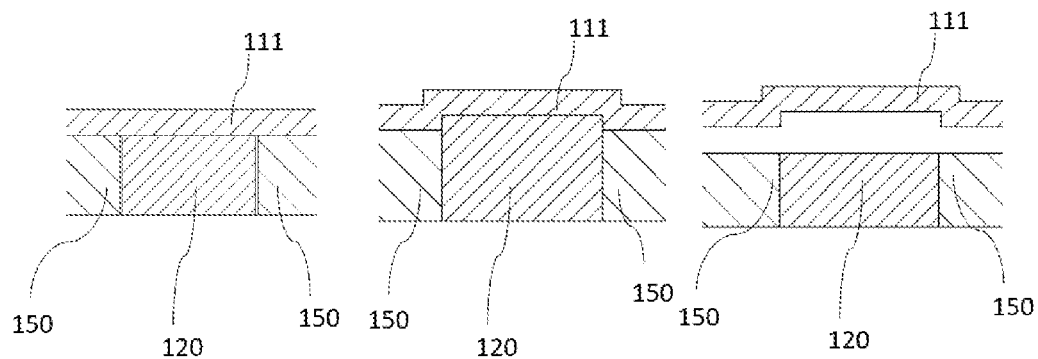
FIG. 11 shows, in a schematic cross sectional view, details of the contact between the diaphragm and spacer, and a further development for this contact.

The thermoforming is preferably carried out when a new diaphragm, for example with a new cartridge, is loaded to the apparatus. FIG. 11 is an exemplary schematic view of part of a diaphragm 111 and a spacer 120 in a guide delimited by the guide walls 150. FIG. 11 illustrates, by way of example, the spacer and the diaphragm before the thermoforming (left), and the modification of the diaphragm layer induced by the spacer during thermoforming (middle). A separate state is shown on the right of the FIG. 11 for emphasizing that the diaphragm retains its shape after thermoforming. The thermoforming adapts the diaphragm to the spacer's shape and dimension. For instance the diaphragm may adopt a 3D bellows-like structure, which is shown in the FIG. 11 in an exaggerated manner for illustration purposes. With a thermoformed diaphragm, it was surprisingly found that large spacer strokes are possible with a very minimal stress on the diaphragm during processing.

In one example for thermoforming, at a temperature higher than the service temperature, for example 400° C., the material of the diaphragm layer softens and its tensile modulus decreases to such a level that with a moderately high pressure (for example at least 1 MPa), the layer easily conforms to the spacer permanently. For instance, the diaphragm 111 layer conforms to the protruding spacer 120 when it is pressed against a dummy semiconductor device. This shape, such as a bellows-like shape, may accommodate spacer strokes, at the service temperature, such as from about 120° C. to about 300° C. (for example 250° C.), where the tensile modulus of the layer is higher than at thermoforming temperature, thus retaining its thermoformed shape.

For enabling thermoforming, the apparatus may comprise a controller configured to control the heaters such that the temperature of the diaphragm 111 layer contacting the spacer 120 can be set up to the thermoforming temperature, preferably at least 400° C.

Figure 12:
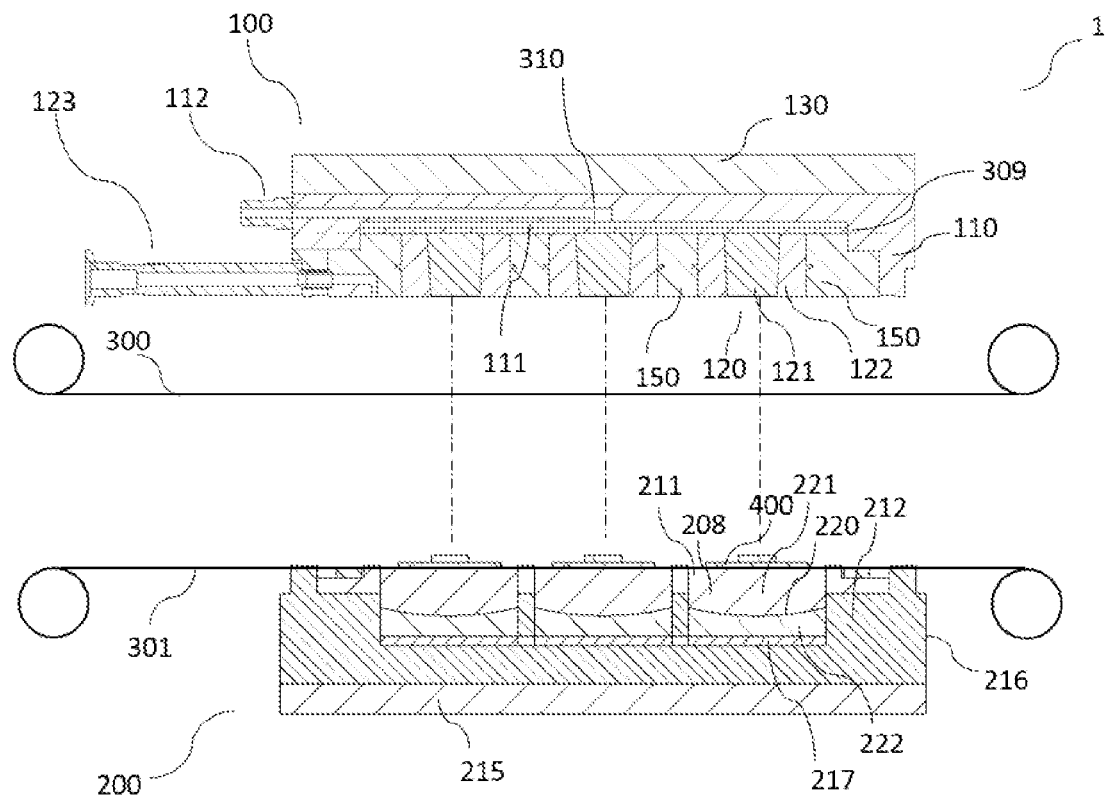
FIG. 12 shows a schematic cross sectional view of the apparatus according to a further embodiment of the invention, wherein a bottom protection film is provided over the holder for supporting the semiconductor device.

In a further development of the invention, the second tool 200 is operative for receiving a bottom-protection film, such as a film in a cartridge, such that the bottom-protection film may be arranged between the second and the first tools, and between the holder and the semiconductor device. The bottom-protection film serves at least one of the purposes of: (i) protecting the semiconductor device's bottom surface from contamination, (ii) accommodate the relative dimension changes due to CTE mismatch, and (ii) eliminating the need for a device carrier, which may otherwise be needed in other cases. The bottom-protection film may be elastic. An elastic film may accommodate the possible different thermal expansions of the holder and the semiconductor device, therefore, a CTE matching between the bottom-protection film and the semiconductor device may not be required. A bottom-protection film may be a high temperature resistant elastic film. The bottom-protection film conforms to the shape of the device in contact and the low tensile modulus may absorb any relative dimension changes (for example due to temperature change) therefore reducing the internal stress of the semiconductor device. FIG. 12 shows an example similar to that shown in FIG. 4, of an apparatus 1 including a first tool 100 and a second tool 200. The first tool 100 includes the pressure application component 309 and the spacer 120 in the guide delimited by the guide walls 150. The second tool 200 includes a holder 208 for the semiconductor device 400. The example of FIG. 12 includes a bottom-protection film 301 between the holder 208 and the semiconductor device 400. In the present example, the film is supported in a cartridge, therefore a new film 301 may be positioned or indexed into position, for receiving the semiconductor device 400 before carrying out the processing of the semiconductor device. The bottom-protection film 301 may be provided to accommodate the semiconductor device's warpage, prevent semiconductor's device bottom surface contamination, and reduce the internal stress to prevent cracking. The bottom-protection film 301 makes tooling simpler and lowers the cost by eliminating the need to select a device carrier 211 of compatible CTE material.

In one embodiment of the invention, the apparatus includes the protection-film holder and the bottom-protection film holder.

Figure 13:
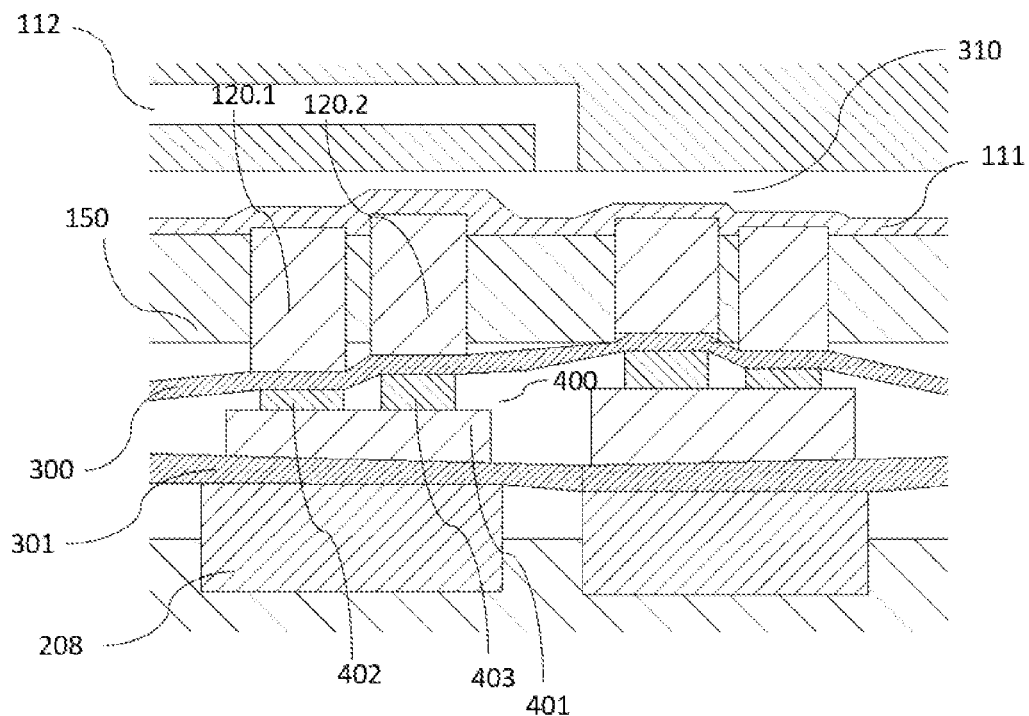
FIG. 13 shows, in a schematic cross sectional view, details of the contact between a spacer and the semiconductor device at two different heights of the semiconductor device, according to a further development of the embodiment of the invention.

In the example of FIG. 13 the semiconductor die 402 and the semiconductor die 403 have different heights. Due to the design of the pressure application component 309, the first spacer 120.1 and the second spacer 120.2 are able to apply the same pressure on the semiconductor device 400. Dice with different heights can be processed together, because two spacers are used. Each spacer 120.1 and 120.2 has a gap 118 from its corresponding guide wall 150 (gap not shown), and the gaps 118 allow each spacer 120.1 and 120.2 to tilt and adapt itself to the respective surface angle of the corresponding semiconductor dice 402 and 403. The right side of FIG. 13 shows the configuration of a similar set of spacers 120 and holder 208 for a semiconductor device 400 with different die thicknesses. It can be seen that the spacers 120 can easily adapt to this condition. The bottom-protection film 301 functions to protect the bottom surface of the semiconductor device 400, in this case the bottom surface of the substrate 401. The bottom-protection film 301 conforms to expansion and contraction of the bottom surface of the semiconductor device during heat processing, thus reducing the internal stress in the semiconductor device 400. A duct 112 is shown in FIGS. 12 and 13 as an example for introducing a fluid. The bottom-protection film 301 can also be used in other embodiments of the invention, for example wherein the chamber of the pressure application component 309 includes an incompressible material.

Figure 14:
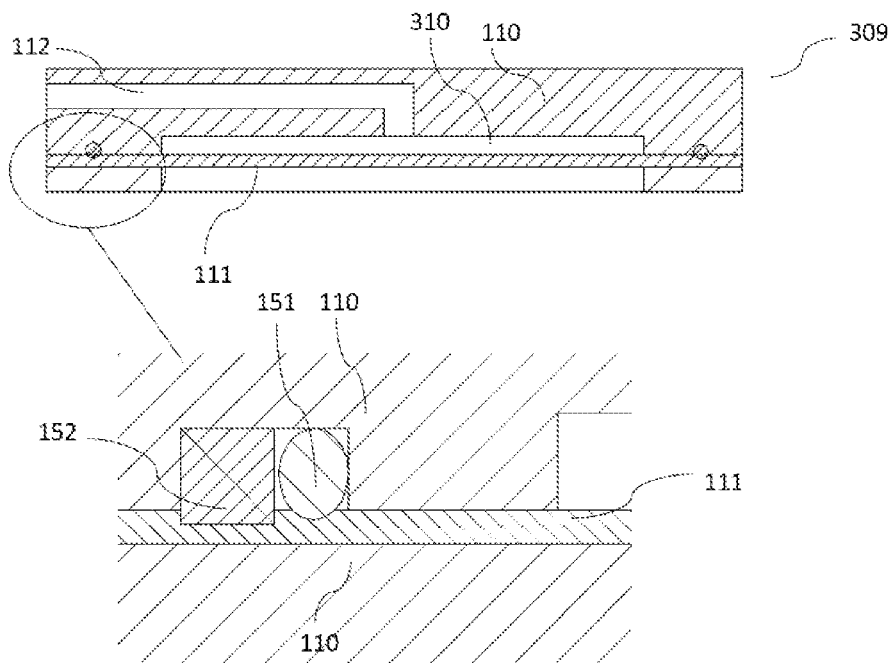
FIG. 14 shows a schematic cross sectional view of the connection of the diaphragm to the chamber of the first tool, according to a further development of an embodiment of the invention.
Figure 15:
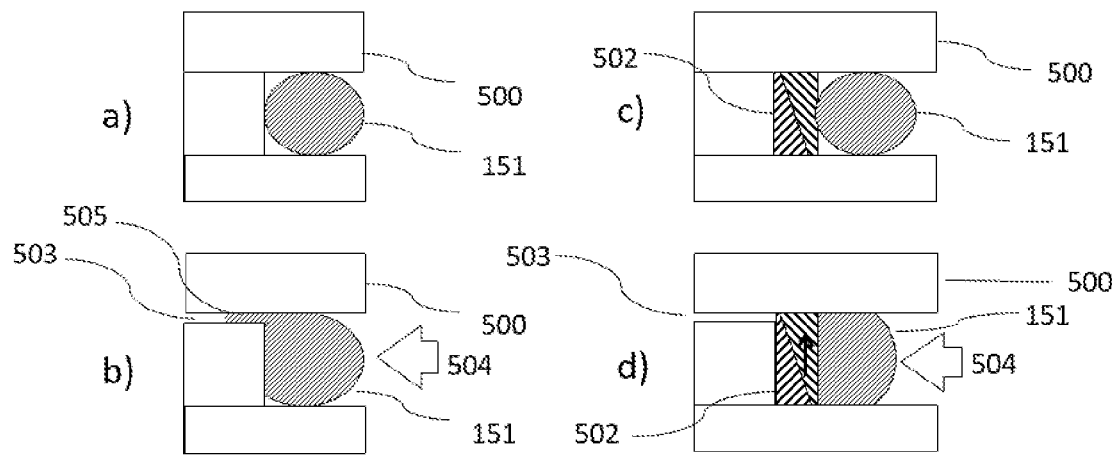
FIG. 15 shows a schematic of the connection of FIG. 14 in comparison with a comparative example.

FIG. 14 shows details of the first tool 100 for illustrating a further development of the invention. FIG. 14 shows a pressure application component 309, including a diaphragm cartridge 110 and a chamber 310 for receiving the pressure transmission medium, and a diaphragm 111. The o-ring 151, shown in the magnified area, improves the sealing between the diaphragm 111 and the chamber 310. In yet a further development of the invention, a second ring 152 is used surrounding the o-ring 151. The second ring 152 is preferably a wedge backup ring, also simply referred to as wedge ring. The second ring 152 comprises a wedge shaped cross-section. The wedge backup ring 152 prevents the o-ring 151 from extrusion and damage under high pressure. FIG. 15 shows an o-ring 151 which is held within metal walls 500 and which seals the chamber 310 against the diaphragm 111. The diaphragm 111 may itself be held in a support ring. During application of high pressure, represented by the arrow 504 in FIG. 15b), the o-ring may, due to the difference in pressure, extrude to a space 503 to result in a quantity of extruded o-ring material 505 within the space 503 due to high pressure. The extruded o-ring material 505 may even increase the space 503. Thus, during high pressure application, the o-ring 151 may be damaged and the pressure transmission medium may leak. FIGS. 15c) and d) show a case wherein a wedge backup ring 502 is used, the ring includes two slidable parts, slidable relative to each other, for example two wedges, such that they can adjust to the height of the cavity in which the wedge backup ring 502 and the o-ring 501 are contained, thus blocking the o-ring 151 to prevent it from being extruded into the space 503. This effectively avoids damage to the o-ring 151 and prevents leakage of the pressure transmission medium, even after various cycles of high and low pressure.

The present invention also envisages a leak detection method. After each process cycle of the apparatus, a gas (for example nitrogen) under a high pressure, for example 200 k PA, is introduced between the 2 layers of the diaphragm, and the inlet valve is then closed. The pressure is then monitored, for example with a pressure gauge monitor. If a significant pressure drop is detected, for example 10% of the initial pressure, then a leak may be reported, for example, by an automatic software. Therefore, it can be known when maintenance is required.

Figure 16A:
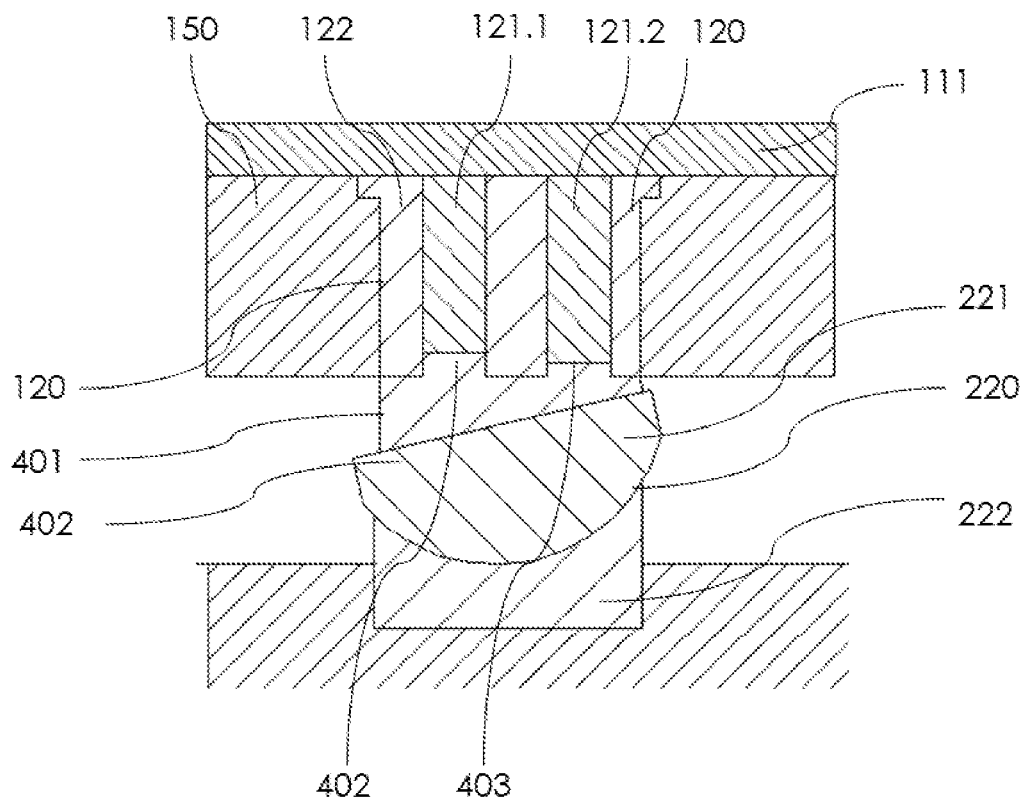
FIGS. 16A and 16B show schematic cross-sectional views of the spherical bearing in association with the holder.
Figure 16B:
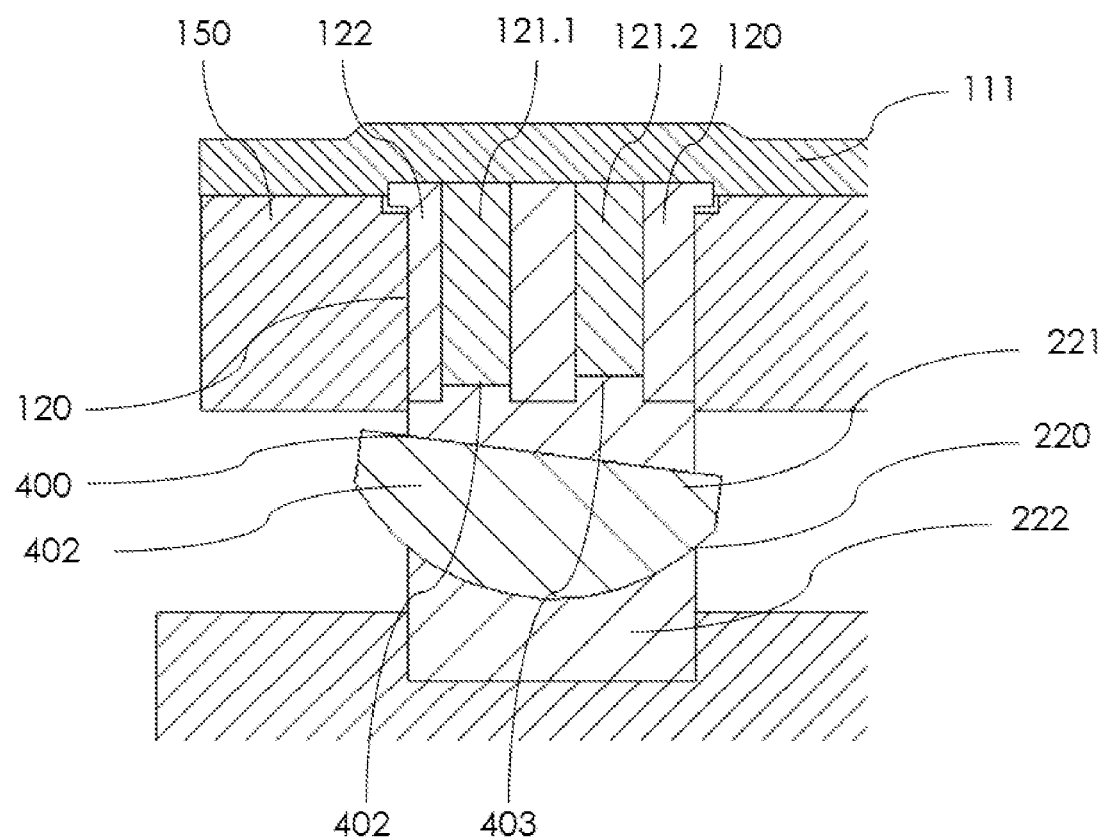

FIG. 16A shows an example of a spacer 120 according to the invention including two inner parts 121.1 and 121.2 and one outer part 122. A semiconductor device 400 is shown by way of example including a substrate 401, a semiconductor die 402 and a semiconductor die 403. The inner part of the spacer 121.1 exerts pressure on one semiconductor die 402 and the inner part 121.2 exerts pressure on the other semiconductor die 403. The outer part 122 of the spacer exerts pressure to the substrate 401. The spherical bearing 220 rotates until the top surface of the semiconductor device 400 is substantially parallel to the lower surface of the spacer 120. This is necessary when the semiconductor device 400 has top and bottom surfaces which are not parallel. Hence, the spherical bearing 220 rotates in order to compensate for the non-parallel sides of the semiconductor device, thus leveling the top surface of the semiconductor device 400. FIG. 16B shows how the apparatus can adapt to a semiconductor device 400 which is shaped or positioned, differently from the semiconductor device 400 shown in FIG. 16A. The semiconductor device 400 in FIG. 16B is also thicker, thus, the spacer 120 protrudes out from the top surface of the guide and its height is compensated by the diaphragm 111. The diaphragm 111 conforms to the top surface of the spacer 120 which is protruding from the top surface of the guide. Thus homogeneous forces can be applied on the semiconductor device 400. The inner and outer parts 121, 122 also allow for adjusting the ratio of the pressure on the die and the pressure on the substrate, for example by adjusting the respective areas of the top surfaces of the inner and outer parts.

Figure 17:
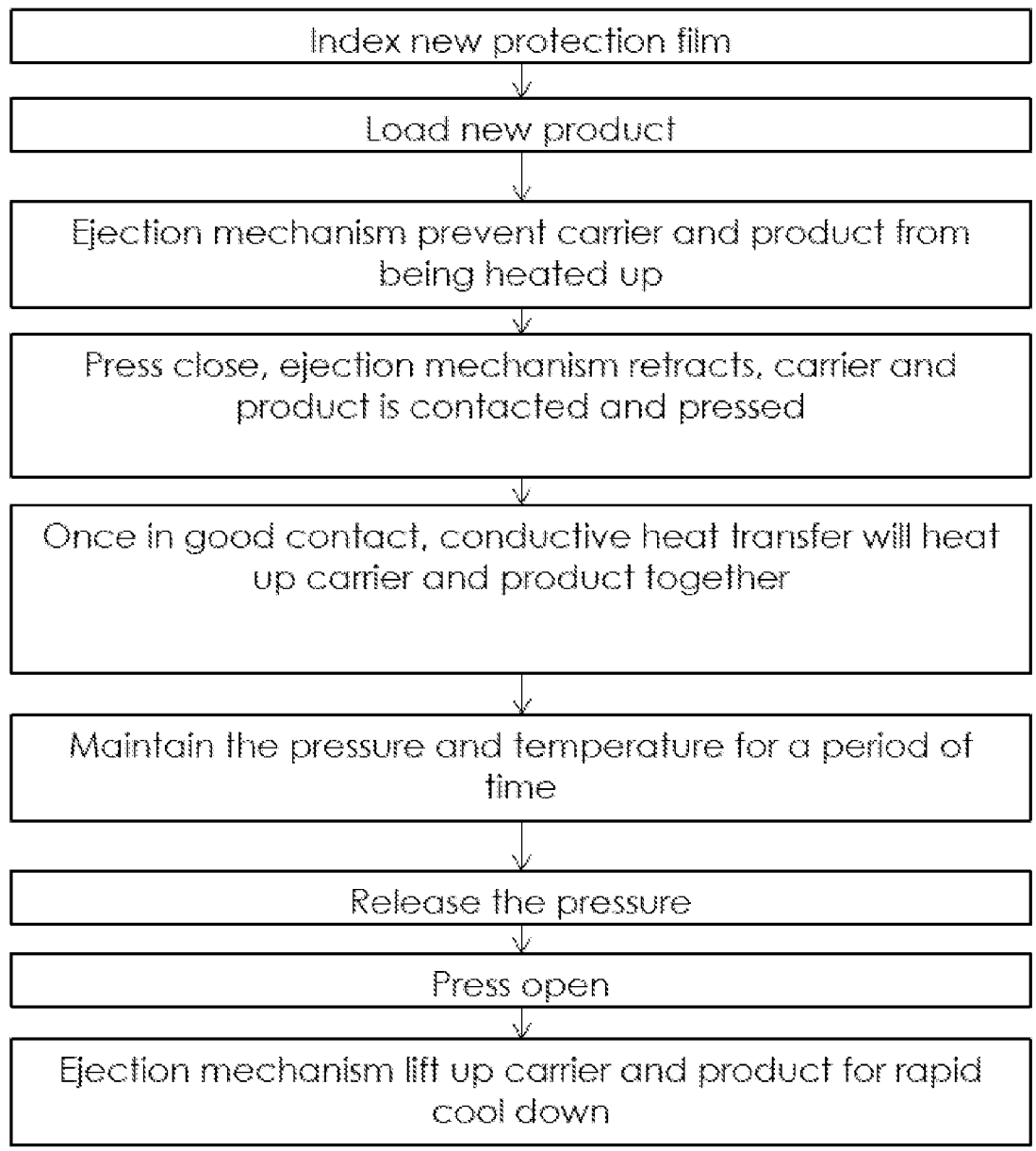
FIG. 17 shows an exemplary flow chart for a method according to an embodiment of the invention.

FIG. 17 shows a flow chart representing the steps of an embodiment of a method for processing a semiconductor according to the invention. In a step, the protection film 300 may be indexed, meaning it is positioned in a pre-determined position. In a step, the semiconductor device 400 may be loaded, for example onto a holder 208. The ejection mechanism 214 is provided in such a state that the semiconductor device 400 and carrier if present, are not heated up. When bringing the apparatus into a coupled state, for instance by pressing a "close" button on a control panel, the method may include the ejection mechanism 214 being retracted so that the carrier and device are brought into contact and pressed between the spacer and the holder. Upon contact, the semiconductor device 400 may be heated up, for example by conductive heat transfer that heats up the carrier (if present) and semiconductor device 400 together. When the CTE of the carrier and the semiconductor device 400 are compatible, the internal stress generated in the semiconductor device can be minimized. The pressure and/or temperature may be maintained, each for a respective period of time, during the processing of the semiconductor device 400. After a predetermined period of time, the pressure may be released. The apparatus may then be brought into the uncoupled state, for example by pressing "open" on a control panel. The ejection mechanism 214 may be used to lift up the semiconductor device 400 for rapid cool down.

Figure 18:
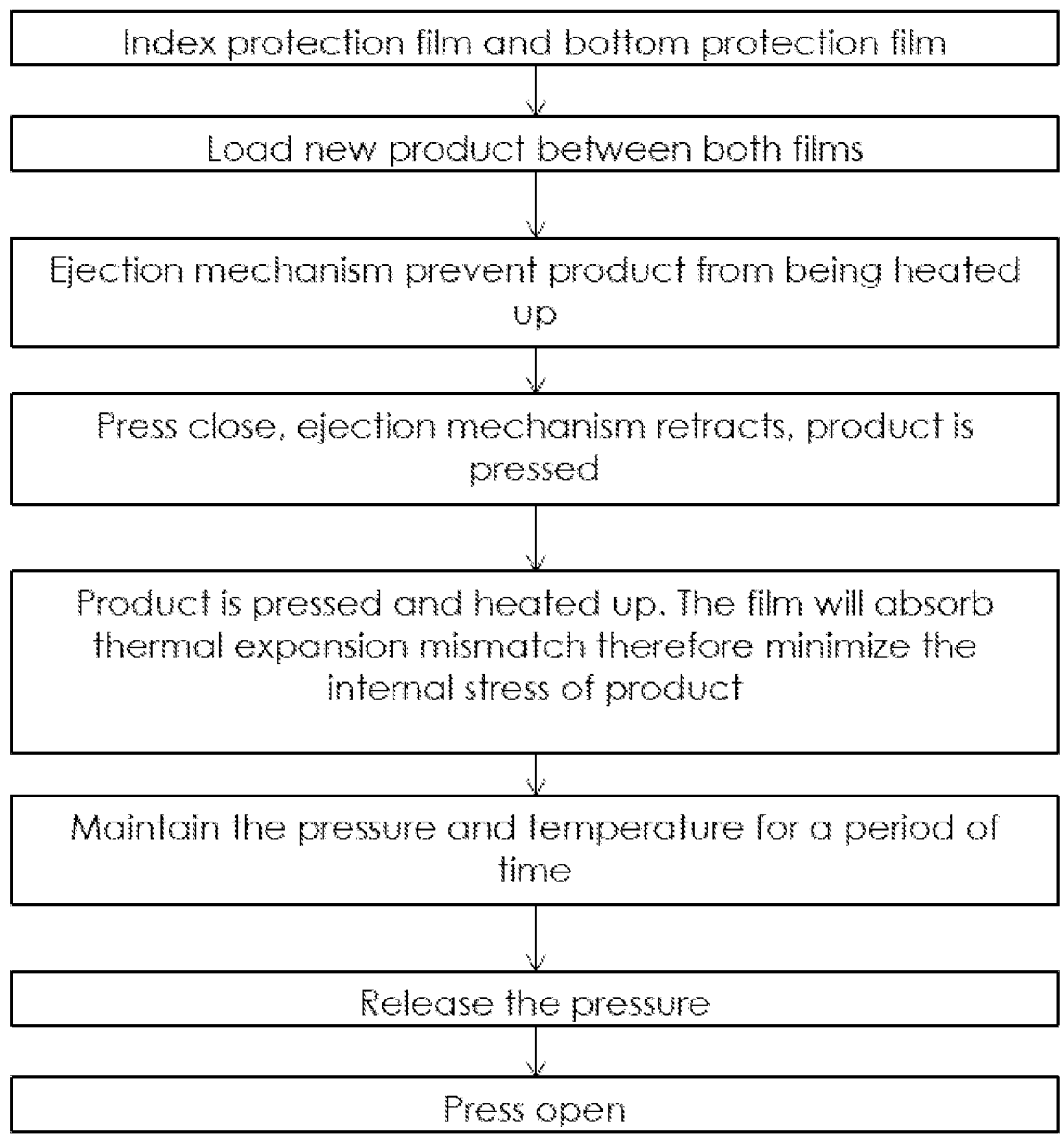
FIG. 18 shows another exemplary flow chart for a method according to another embodiment of the invention.

FIG. 18 shows a flow chart representing the steps of another embodiment of a method for processing a semiconductor device 400 according to the invention. In a step, the protection film 300 may be indexed, meaning to position the film 300 in a pre-determined position. In a step, the semiconductor device 400 may be loaded, for example onto the bottom protection film 301 and (after coupling the apparatus) under the protection film 300. The ejection mechanism 214 is provided in such a state that the semiconductor device 400, and carrier (if present), are not heated up. When bringing the apparatus into a coupled state, for example by pressing a "close" button on a control panel, the method may include the ejection mechanism 214 retracting so that the device (and carrier if present) is contacted and pressed between the spacer and the holder. In contact, the semiconductor device 400 may be heated, for example by conductive heat transfer, by the heat source. The pressure and/or temperature may be maintained, each for a respective period of time, while processing the semiconductor device 400. After a determined period of time, the pressure may be released. The apparatus 1 may be brought into the uncoupled state, for example by pressing "open" on a control panel. The ejection mechanism 214 may be used to lift up the semiconductor device 400 for rapid cool down.

The invention claimed is:
1. An apparatus, for applying pressure to press a semiconductor device against a substrate during a molding or sintering process, the apparatus comprising:
  a first tool comprising:
    a guide comprised in a plate having guide walls;

a spacer located within the guide walls and moveable in the guide, wherein a gap is defined between the spacer and the guide walls adjacent to the spacer and is operable to allow the spacer to tilt in relation to the guide walls; and a pressure application component comprising a chamber and a diaphragm separating a pressure transmission medium in the chamber from the spacer, the diaphragm being in contact with and supported by both the plate and the spacer; and a second tool including a holder which is configured to hold the substrate and the semiconductor device, wherein the first and second tools are moveable relative to each other between an uncoupled state and a coupled state;

wherein the spacer comprises:

a first portion at a first end of the spacer next to the pressure application component, wherein in the coupled state, the pressure application component is operable to apply a force as a first pressure to the first portion; and a second portion at a second end of a spacer opposite to the first end, the second portion being remote from the pressure application component, wherein in the coupled state, the second portion is proximate the semiconductor device and is operable to transmit the force from the pressure application component to the semiconductor device against the substrate as a second pressure.

2. The apparatus according to claim 1, wherein the gap is smaller at the first portion next to the pressure application component than at the second portion remote from the pressure application component.

3. The apparatus according to claim 1, wherein the width of the gap between the spacer and the guide is from about 0.001 mm to about 5 mm.

4. The apparatus according to claim 1, wherein the width of the gap, at the first portion proximate the pressure application component is from about 0.001 mm to about 1 mm.

5. The apparatus according to claim 1, wherein the width of the gap, at the second portion distal from the pressure application component is from about 0.01 mm to about 5 mm.

6. The apparatus according to claim 1, wherein the first tool further comprises an o-ring to hold the diaphragm in place in the pressure chamber.

7. The apparatus according to claim 6, wherein the first tool further comprises a ring, with larger diameter than the o-ring operable to surround the o-ring for preventing extrusion of the o-ring.

8. The apparatus according to claim 1, wherein the spacer further comprises a first surface and a second surface, wherein the first surface is a surface contactable to the pressure application component, and wherein an area of the first surface is larger than an area of the second surface, so that a pressure applicable by the spacer when fully utilizing the second surface is larger than a pressure applied by the pressure application component to the first surface.

9. The apparatus according to claim 1, wherein the edges of the spacer are deburred with rounded edges of radius of or less than 0.2 mm.

10. The apparatus according to claim 1, wherein the spacer further comprises an inner part and an outer part, wherein the inner part is movable relative to the outer part.

11. The apparatus according to claim 10, wherein a motion of the inner part relative to the outer part, in a direction away from the pressure application component, is restricted.

12. The apparatus according to claim 1, wherein the holder comprises a spherical bearing operative to level the semiconductor device in relation to the spacer when changing from the uncoupled state to the coupled state.

13. The apparatus according to claim 1, wherein the second tool is operable to receive a bottom protection film over a holder for the semiconductor device comprised in the second tool.

14. The apparatus according to claim 1, further comprising a heating block, wherein a distance between the heating block and the holder is adjustable.

15. The apparatus according to claim 1, further comprising:

a plurality of sets, each set comprising a spacer and a guide that are the same as the spacer and the guide; and a plurality of holders, wherein each holder is associated with one or more of the plurality of sets.

16. The apparatus according to claim 1, further comprising a resilient member located within the gap between the spacer and the guide for applying a force to the guide and spacer.

17. A method of applying pressure to press a semiconductor device against a substrate during a molding or a sintering process, comprising:

providing an apparatus with a first tool and a second tool moveable relative to each other, wherein:

the second tool comprises a holder that is configured to hold the substrate and the semiconductor device;

the first tool comprises a pressure chamber, a movable spacer located within guide walls of a guide comprised in a plate, the spacer being moveable in the guide, and a gap between the spacer and the guide walls adjacent to the spacer that is operable to allow the spacer to tilt in relation to the guide walls; and a pressure application component comprising a chamber and a diaphragm separating a pressure transmission medium in the chamber from the spacer, the diaphragm being in contact with and supported by both the plate and the spacer, the first tool and the second tool are in an uncoupled state;

arranging the semiconductor device and the substrate on the holder;

bringing the first tool and the second tool from the uncoupled state to a coupled state;

compressing the semiconductor device between the spacer and the holder, by applying pressure from the pressure chamber on the spacer to press the semiconductor device against the substrate;

waiting a pre-determined period of time;

bringing the first tool and the second tool from the coupled state to the uncoupled state.

18. A method of processing a semiconductor according to claim 17, further comprising:

providing a bottom protection film on the second tool covering the holder; and wherein the step of arranging the semiconductor device on the holder comprises:

arranging the semiconductor device on the holder covered by the protection film, the semiconductor being arranged on the protection film.

19. A method of processing a semiconductor according to claim 17, further comprising:

providing a carrier on the holder; and wherein the step of arranging the semiconductor device on the holder comprises arranging the semiconductor device on the carrier.

\* \* \* \* \*